(12) United States Patent
Liu et al.

(10) Patent No.: US 10,867,151 B2
(45) Date of Patent: Dec. 15, 2020

(54) TERMINAL, METHOD FOR CONTROLLING TERMINAL, METHOD FOR MANUFACTURING TERMINAL, AND STORAGE MEDIUM

(71) Applicant: Beijing Xiaomi Mobile Software Co., Ltd., Beijing (CN)

(72) Inventors: Anyu Liu, Beijing (CN); Zhongsheng Jiang, Beijing (CN); Song Li, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 0 days.

(21) Appl. No.: 16/277,339

(22) Filed: Feb. 15, 2019

(65) Prior Publication Data

US 2019/0325187 A1  Oct. 24, 2019

(30) Foreign Application Priority Data

Apr. 24, 2018 (CN) .......................... 2018 10 373347

(51) Int. Cl.
*G06K 9/00* (2006.01)
*G06F 3/0488* (2013.01)
*H05K 1/18* (2006.01)

(52) U.S. Cl.
CPC ......... *G06K 9/0002* (2013.01); *G06F 3/0488* (2013.01); *G06K 9/0004* (2013.01); *H05K 1/189* (2013.01); *H05K 2201/10151* (2013.01)

(58) Field of Classification Search
None
See application file for complete search history.

(56) References Cited

U.S. PATENT DOCUMENTS

| 2012/0249452 A1* | 10/2012 | Kitano | G06F 1/1656 345/173 |
|---|---|---|---|
| 2014/0168867 A1 | 6/2014 | Choi et al. | |
| 2015/0071509 A1* | 3/2015 | Myers | G06K 9/0002 382/124 |
| 2017/0083693 A1 | 3/2017 | Bengtsson et al. | |
| 2017/0285778 A1 | 10/2017 | Liang | |

(Continued)

FOREIGN PATENT DOCUMENTS

| CN | 105138074 A | 12/2015 |
|---|---|---|
| CN | 204883484 U | 12/2015 |
| CN | 106250869 A | 12/2016 |

(Continued)

OTHER PUBLICATIONS

International Search Report of PCT Application No. PCT/CN2018/097882, dated Jan. 24, 2019, issued by the ISA/CN—State Intellectual Property Office of the P.R. China.

(Continued)

*Primary Examiner* — Joseph R Haley
(74) *Attorney, Agent, or Firm* — Finnegan, Henderson, Farabow, Garrett & Dunner, L.L.P.

(57) ABSTRACT

The present disclosure provides a terminal, a method for controlling a terminal, a method for manufacturing a terminal, and a storage medium. The terminal may include a housing. A side of the housing may have a button hole. A physical button may be provided at the button hole. The side of the housing may be further provided with a fingerprint recognition region surrounding the button hole.

9 Claims, 6 Drawing Sheets

(56) References Cited

U.S. PATENT DOCUMENTS

2018/0157411 A1* 6/2018 Kim .................... G06F 3/04886

FOREIGN PATENT DOCUMENTS

| | | |
|---|---|---|
| CN | 106603762 A | 4/2017 |
| EP | 2 819 153 A2 | 12/2014 |
| JP | 2017125141 A | 7/2017 |

OTHER PUBLICATIONS

Extended Search Report for European Application No. 19161205.0 issued by the European Patent Office, dated Sep. 3, 2019.
Office Action in counterpart Japanese Application No. 2018-549572, dated Jul. 21, 2020.

* cited by examiner

```
┌─────────────────────────────────────────────────────────────┐
│ Performing fingerprint parameter collection by a fingerprint │── 201
│   recognition region when a physical button is triggered    │
└─────────────────────────────────────────────────────────────┘
                              │
                              ▼
┌─────────────────────────────────────────────────────────────┐
│ Performing recognition on a fingerprint parameter collected  │── 202
│   when the fingerprint parameter is collected successfully   │
└─────────────────────────────────────────────────────────────┘
```

Fig. 12

```
┌─────────────────────────────────────────────────────────────┐
│    Providing a housing, a side of the housing having a      │── 301
│                        button hole                           │
└─────────────────────────────────────────────────────────────┘
                              │
                              ▼
┌─────────────────────────────────────────────────────────────┐
│         Providing a physical button at the button hole       │── 302
└─────────────────────────────────────────────────────────────┘
                              │
                              ▼
┌─────────────────────────────────────────────────────────────┐
│ Providing a fingerprint recognition region surrounding the   │── 303
│           button hole on the side of the housing             │
└─────────────────────────────────────────────────────────────┘
```

TERMINAL, METHOD FOR CONTROLLING TERMINAL, METHOD FOR MANUFACTURING TERMINAL, AND STORAGE MEDIUM

CROSS REFERENCE TO RELATED APPLICATION

This application claims priority to Chinese Patent Application No. 201810373347.9, filed on Apr. 24, 2018, the entire content of which is incorporated herein by reference.

TECHNICAL FIELD

The present disclosure relates to a field of mobile technology, and more particularly to a terminal, a method for controlling a terminal, a method for manufacturing a terminal, and a storage medium.

BACKGROUND

Terminals have become indispensable electronic product in people's lives. Various terminals such as mobile phones, tablet computers and notebook computers greatly increase convenience of people's lives.

Some terminals may be configured with unlocking mechanisms. Such a terminal may include, for example, a housing, a fingerprint recognition region provided in the housing, and some physical buttons. When a user wants to unlock the terminal, the physical button may be clicked to wake up the terminal (for example, when the terminal is provided with a display screen, the display screen may be lighted up by clicking the physical button), and then the fingerprint recognition region is touched to unlock the terminal.

However, these steps of unlocking the terminal by the user are relatively cumbersome.

SUMMARY

According to an aspect of the present disclosure, a terminal is provided. The terminal may include a housing. A side of the housing may have a button hole. A physical button may be provided at the button hole. The side of the housing may be further provided with a fingerprint recognition region surrounding the button hole.

According to another aspect of the present disclosure, a method for controlling a terminal is provided. The method may be applied to a terminal. The terminal may include a housing. A side of the housing may have a button hole. A physical button may be provided at the button hole. The side of the housing may be further provided with a fingerprint recognition region surrounding the button hole. The method may include: performing fingerprint parameter collection by the fingerprint recognition region when the physical button is triggered; and performing recognition on the fingerprint parameter collected when the fingerprint parameter is collected successfully.

According to another aspect of the present disclosure, a method for manufacturing a terminal is provided. The method may include: providing a housing, a side of the housing being provided with a button hole; providing a physical button at the button hole; and providing a fingerprint recognition region surrounding the button hole on the side of the housing.

According to another aspect of the present disclosure, a terminal is provided. The terminal may include a processor, a memory, and a housing. The memory may be configured to store instructions executable by the processor. A side of the housing may have a button hole. A physical button may be provided at the button hole. The side of the housing may be further provided with a fingerprint recognition region surrounding the button hole. The processor may be configured to: perform fingerprint parameter collection by the fingerprint recognition region when a preset condition is satisfied; and perform recognition on the fingerprint parameter collected when the fingerprint parameter is collected successfully.

According to another aspect of the present disclosure, a storage medium is provided. The storage medium may store at least one instruction, and the at least one instruction may be configured to be loaded and executed by a processor to implement a method for controlling a terminal.

BRIEF DESCRIPTION OF THE DRAWINGS

The accompanying drawings, which are incorporated in and constitute a part of the specification, illustrate embodiments consistent with the present disclosure and serve to explain the principles of the present disclosure together with the specification.

DETAILED DESCRIPTION

Exemplary embodiments will be described in detail herein, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with some aspects related to the present disclosure as detailed in the appended claims.

At present, housings of various terminals such as mobile phones and tablet computers are usually in a plate shape, and one of two planar surfaces in the plate-shaped housing may be provided with a display screen. A fingerprint recognition region may be provided in manners depicted in FIGS. 1 and 2.

Figure 1:
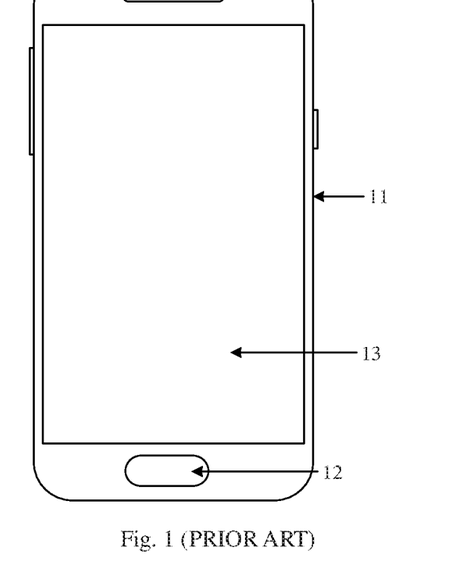
FIG. 1 is a schematic diagram illustrating a traditional terminal.

FIG. 1 is a schematic diagram illustrating a traditional terminal in which the fingerprint recognition region is provided on a front surface of the housing provided with the display screen. As illustrated in FIG. 1, a fingerprint recognition region 12 and a display device 13 are provided on the same surface of the housing 11. It may be seen that, after a user clicks a physical button (for example, when the user holds the terminal with one hand, and clicks the physical button on the surface of the terminal with a thumb), it may be more difficult for the user to touch the fingerprint recognition region 12. In addition, existence of the fingerprint recognition region 12 may severely reduce a screen-to-body ratio of the terminal (the screen-to-body ratio may be a radio between an area of the display screen and an area of the surface of the terminal where the display screen is located).

Moreover, as illustrated in FIG. 1, the fingerprint recognition region 12 provided at the bottom of the display screen 13 may further interfere with other components in the terminal such as an antenna component, which increases difficulty in providing the fingerprint recognition region 12.

Figure 2:
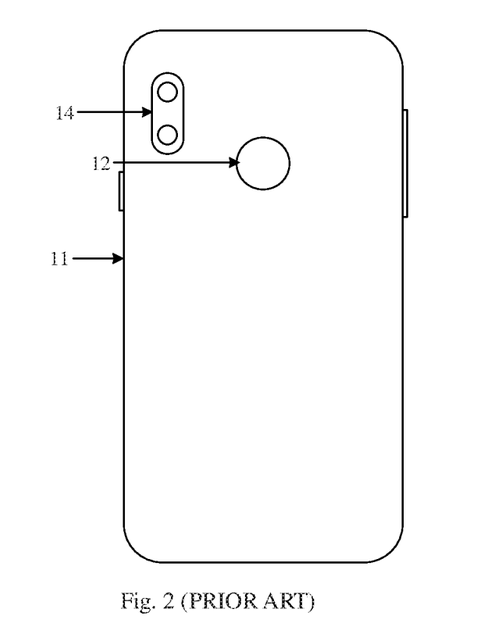
FIG. 2 is a schematic diagram illustrating another traditional terminal

FIG. 2 is a schematic diagram illustrating a traditional terminal in which the fingerprint recognition region is provided on a back surface of the housing which is opposite to the display screen. As illustrated in FIG. 2, the fingerprint recognition region 12 and the display device are provided on opposite surfaces of the housing 11. It may be seen that, after the user clicks the physical button (for example, when the user holds the terminal with one hand, and clicks the physical button on the surface of the terminal by the thumb), it may be difficult for the user to touch the fingerprint recognition region 12.

In addition, the back surface of the housing 11 which is opposite to the display screen is usually provided with a camera 14. The fingerprint recognition region 12 may conflict with an area where the camera 14 is located, and may occupy space where a battery in the housing is disposed.

Embodiments of the present disclosure provide terminals and methods for controlling terminals without the aforementioned shortcomings.

Figure 3:
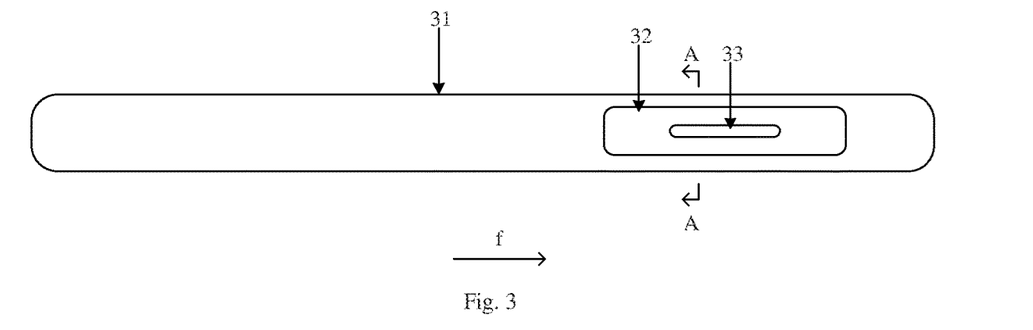
FIG. 3 is a schematic diagram illustrating a terminal according to exemplary embodiments of the present disclosure.

FIG. 3 is a schematic diagram illustrating a terminal according to exemplary embodiments of the present disclosure. The terminal may include a housing 31.

In some embodiments, a side of the housing 31 may have a button hole (not shown in FIG. 3), and a physical button 33 may be provided at the button hole.

In some embodiments, the side of the housing 31 may be further provided with a fingerprint recognition region 32 surrounding the button hole.

With the terminal provided by embodiments of the present disclosure, by combining the fingerprint recognition region with the region occupied by the physical button, the user may touch the fingerprint recognition region simultaneously when clicking the physical button. The aforementioned shortcomings associated with unlocking the terminal are solved, and the steps required to unlock the terminal are simplified.

Figure 4:
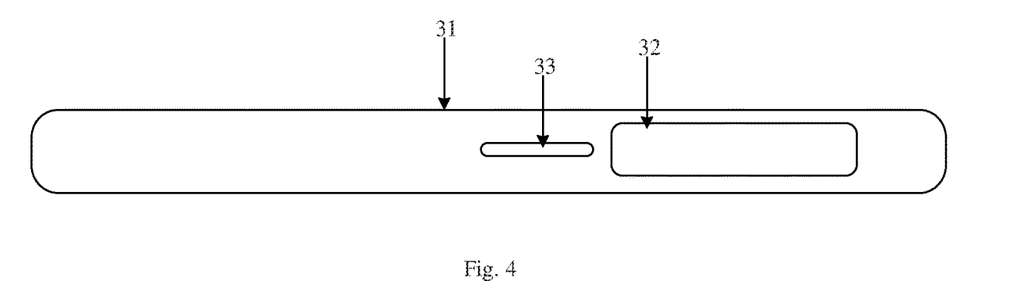
FIG. 4 is a schematic diagram illustrating another terminal according to exemplary embodiments of the present disclosure.

In addition, as illustrated in FIG. 4, when the physical button 33 and the fingerprint recognition region 32 are independently provided in the housing 31, a larger area of the housing will be occupied. However, in the terminal provided by embodiments of the present disclosure illustrated in FIG. 3, the fingerprint recognition region and the physical button are combined, which reduces the area of the housing occupied by the fingerprint recognition region and the physical button.

Figure 5:
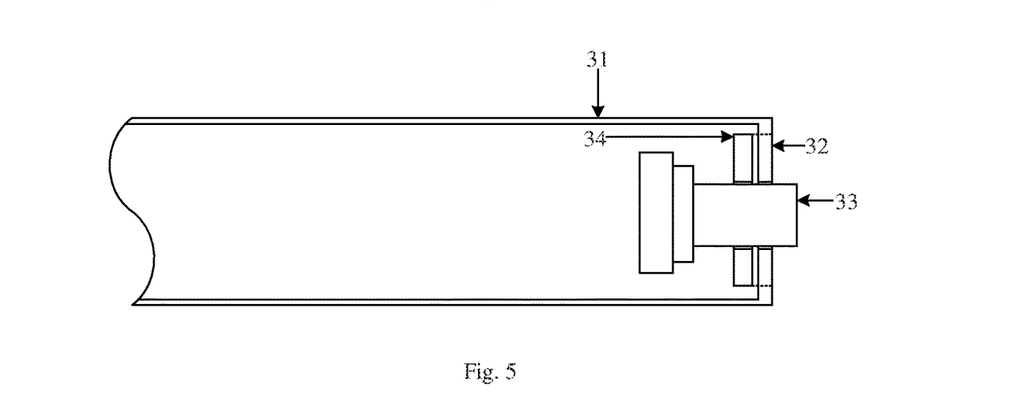
FIG. 5 is a sectional view of the terminal illustrated in FIG. 3.

FIG. 5 is a cross-sectional view of the terminal illustrated in FIG. 3 along A-A.

In some embodiments, a fingerprint sensor 34 is provided in the housing 31.

In some embodiments, a region where a front projection of the fingerprint sensor 34 on an outer wall of the housing 31 is located is the fingerprint recognition region 32.

In some embodiments, the fingerprint sensor 34 may be an ultrasonic fingerprint sensor or an optical fingerprint sensor. When the fingerprint sensor 34 is the optical fingerprint sensor, the side of the housing 31 is made of transparent material.

In some embodiments, the fingerprint sensor 34 may be a film sensor. The film sensor is attached to an inner wall of the housing 31. A thickness of the film sensor may be between 0.1 mm and 0.2 mm. The film sensor may be flexible, which facilitates to be attached to the inner wall of the housing 31.

In some embodiments, the physical button 33 passes through the fingerprint sensor 34 and the button hole in the housing 41 to extend out of the housing 31, which facilitates the user to press the physical button 33. The physical button 33 may be a power button, a volume adjustment button, a customizable button or any other function button.

In some embodiments, the fingerprint sensor 34 is provided in the housing 31, such that the housing 31 may protect the fingerprint sensor 34. However, the fingerprint sensor 34 may further be provided on an outer wall of the housing, which is not limited by embodiments of the present disclosure.

In some embodiments, the housing 31 is in a rectangular plate shape, and the fingerprint recognition region 32 is provided on the side of the housing 31. In some embodiments, the fingerprint recognition region 32 is provided on the side of the housing 31 that is generally perpendicular to the rectangular plate.

In some embodiments, the fingerprint recognition region 32 provided on the side of the housing 31 may not occupy two lager sides of the housing 31 configured to be provided with the display screen and the camera, which reserves sufficient space for the display screen and the camera.

In some embodiments, as illustrated in FIG. 3, an area occupied by the fingerprint recognition region 32 on the side of the housing 31 is greater than an area occupied by the physical button 33 on the side of the housing 31. In this manner, the area of the fingerprint recognition region 32 may be increased, which may in term improve the success rate of fingerprint recognition.

In a particular embodiment, for example, the thickness of the housing 31 may be 8 mm, the length of the fingerprint recognition region 32 in the thickness direction of the housing 31 may be 6 mm, the length of the fingerprint recognition region 32 in a length direction f of the side of the housing may be 18 mm, the length of the physical button 33 in the thickness direction of the housing 31 may be 2 mm, and the length of the physical button 33 in the length direction f may be 12 mm.

Figure 6:
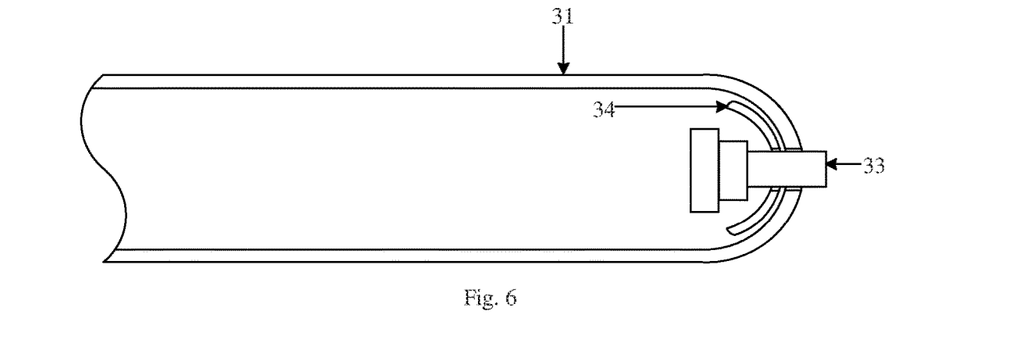
FIG. 6 is a schematic diagram illustrating another terminal according to exemplary embodiments of the present disclosure.

FIG. 6 is a schematic diagram illustrating a terminal according to exemplary embodiments of the present disclosure. As illustrated in FIG. 6, the side of the housing 31 of the terminal may have a protruded curved surface. Furthermore, the front projection of the fingerprint sensor 34 on this side may also be included in the fingerprint recognition region 32. In this manner, the area of the fingerprint recognition region 32 may be increased, which may in term improve the success rate of fingerprint recognition.

It is noted that it may be difficult to bend fingerprint sensors implemented based on silicon-based technology. Thus, when the side of the housing is provided with the sensor based on the silicon-based technology, an area of the sensor based on the silicon-based technology is usually smaller, and the success rate of the fingerprint recognition is not high. However, in some embodiments of the present disclosure, the film sensor based on the fingerprint recognition technology is taken as the fingerprint sensor, such that the fingerprint sensor may bend with the side of the housing, which increases the area of the fingerprint recognition region and improves the success rate of the fingerprint recognition.

In some embodiments, the fingerprint sensor 34 may include a plurality of sub-sensors arranged in an array. The plurality of sub-sensors may respectively perform fingerprint parameter collection. Fingerprint parameters collected by the plurality of sub-sensors may be gathered. In this manner, when one or more sub-sensors fail or do not collect fingerprint parameters, the terminal may still collect the fingerprint parameters of the user, which may improve the success rate of fingerprint recognition.

In addition, the fingerprint sensor 34 may be a single sensor, which is not limited by embodiments of the present disclosure.

In some terminals configured in accordance with embodiments of the present disclosure, a relative position between the film sensor and the housing may be defined in any of following manners as depicted in FIGS. 7-11.

Figure 7:
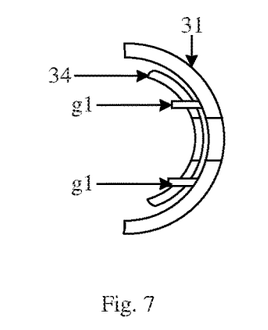
FIG. 7 is a schematic diagram illustrating a portion of a housing and a film sensor in a terminal according to exemplary embodiments of the present disclosure.

FIG. 7 is a schematic diagram illustrating a portion of a housing and a film sensor according to exemplary embodiments of the present disclosure. As illustrated in FIG. 7, an inner wall of the housing 31 is provided with a locating rod g1, the film sensor 34 (that is, the fingerprint sensor) is provided with a locating hole (not shown in FIG. 7), and the locating rod g1 passes through the locating hole. In this way, a position of the film sensor 34 on the inner wall of the housing 31 may be limited by the locating rod g1, such that the film sensor 34 may be provided on the housing 31 at a predefined position.

Figure 8:
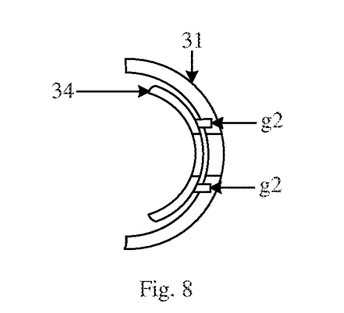
FIG. 8 is a schematic diagram illustrating a portion of a housing and a film sensor in another terminal according to exemplary embodiments of the present disclosure.

FIG. 8 depicts another way of defining the relative position between the film sensor and the housing according to exemplary embodiments of the present disclosure. As illustrated in FIG. 8, an inner wall of the housing 31 is provided with a blind hole (not shown in FIG. 8), the film sensor 34 is provided with a protuberance g2, and the protuberance g2 is located in the blind hole. Such a structure may also limit the position of the film sensor 34 in the inner wall of the housing 31.

Figure 9:
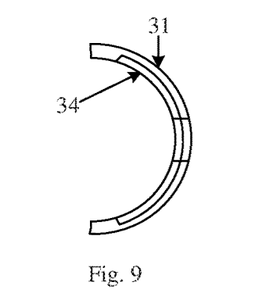
FIG. 9 is a schematic diagram illustrating a portion of a housing and a film sensor in another terminal according to exemplary embodiments of the present disclosure.

FIG. 9 depicts another way of defining the relative position between the film sensor and the housing according to exemplary embodiments of the present disclosure. As illustrated in FIG. 9, an inner wall of the housing 31 is provided with an accommodating groove (not shown in FIG. 9), and the film sensor 34 is provided in the accommodating groove. Such a structure may also limit the position of the film sensor 34 in the inner wall of the housing 31.

In addition, an adhesive film may be provided between the film sensor and the inner wall of the housing. The adhesive film may include adhesive material such as thermosetting glue, water glue, solid film and PVDF (Polyvinylidene Fluoride).

The fingerprint sensor may include an ultrasonic fingerprint sensor. When the fingerprint sensor is an ultrasonic fingerprint sensor, the ultrasonic fingerprint sensor may be configured to transmit ultrasonic waves and receive ultrasonic waves. After the ultrasonic transmitted by the ultrasonic fingerprint sensor passes through the adhesive film and the housing, reflection and incidence may happen at the skin of the user's finger, allowing the reflected ultrasonic to pass through the housing and the adhesive layer and be received by the ultrasonic fingerprint sensor. The terminal may then restore the fingerprint parameter of the user according to the ultrasonic wave received.

Figure 10:
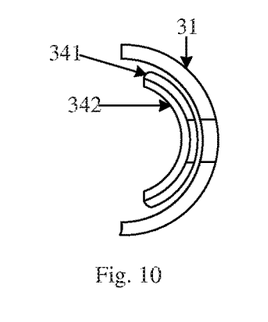
FIG. 10 is a schematic diagram illustrating a film sensor and a substrate in a terminal according to exemplary embodiments of the present disclosure.

FIG. 10 depicts another way of defining the relative position between the film sensor and the housing according to exemplary embodiments of the present disclosure. As illustrated in FIG. 10, a side of the film sensor 341 away from the housing 31 is provided with a substrate 342. The substrate may support and protect the film sensor.

In addition, the side of the film sensor 341 away from the housing 31 may not be provided with the substrate, which is not limited by the present disclosure.

In some embodiments, the side of the housing is made of metal, plastic or glass. In some embodiments, the side of the housing may be a part of a frame of the terminal. In some embodiments, the frame of the terminal may be a metal frame, a plastic frame or a glass frame. When the frame is a metal frame, the metal frame may be made of magnesium, aluminum, magnesium aluminum alloy or 304 stainless steel.

Figure 11:
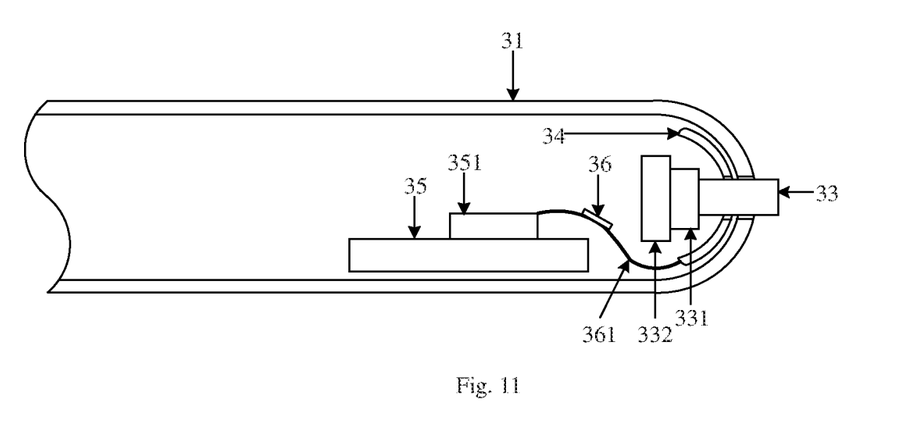
FIG. 11 is a schematic diagram illustrating another terminal according to exemplary embodiments of the present disclosure.

FIG. 11 depicts another way of defining the relative position between the film sensor and the housing according to exemplary embodiments of the present disclosure. As illustrated in FIG. 11, the terminal may further include a connected main board 35 and a fingerprint sensor control IC (integrated circuit) 36.

In some embodiments, the fingerprint sensor control IC 36 may be connected with the fingerprint sensor 34. In some embodiments, the fingerprint sensor control IC 36 may be provided on an FPC (Flexible Printed Circuit) 361, and the fingerprint sensor control IC 36 may establish an electronic connection with the fingerprint sensor 34 and the main board 35 via the FPC 361.

In some embodiments, the FPC 361 may be connected with a BTB Connector (Board-to-board Connector) 351. The BTB Connector 351 may connect FPC 361 with the main board 35.

In some embodiments, the physical button 33 may be in contact with a dome switch 331 in the housing 31, and the dome switch 331 may be in contact with a mechanical stopper 332. The dome switch 3331 may act as a trigger switch. When the physical button 33 squeezes the dome switch 331, the trigger switch may be switched on, and the dome switch 331 may be connected with the main board 35 (not shown in FIG. 11), such that a signal triggered by the physical button 33 may be transmitted to the main board 35. The mechanical stopper 332 may be configured as a support structure of the dome switch 331.

With the terminal provided by embodiments of the present disclosure, by combining the fingerprint recognition region with the region occupied by the physical button, the user may touch the fingerprint recognition region simultaneously when clicking the physical button. The aforementioned shortcomings associated with unlocking a terminal are solved, and the steps required to unlock the terminal are simplified.

Figure 12:
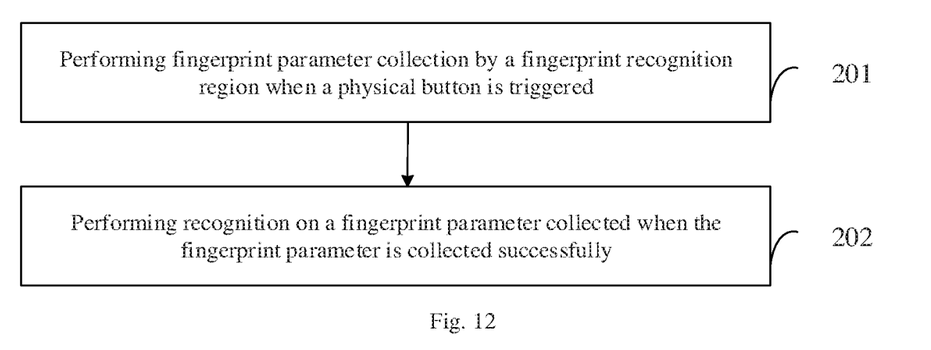
FIG. 12 is flow chart illustrating a method for controlling a terminal according to exemplary embodiments of the present disclosure.

FIG. 12 is flow chart illustrating a method for controlling a terminal according to exemplary embodiments of the present disclosure. The method may be applied to a processor of any terminal illustrated in the foregoing embodiments, and the method for controlling the terminal includes the following blocks.

In block 201, fingerprint parameter collection may be performed by the fingerprint recognition region when the physical button is triggered.

When the physical button is triggered, the processor may perform fingerprint parameter collection using the fingerprint recognition region. The collection procedure may succeed, but may also fail due to problems such as mistaken touch and mistaken contact position of the finger.

In some embodiments, before the physical button is triggered, the processor may close or turn off the fingerprint sensor to reduce power consumption.

In some embodiments, after the physical button is pressed, an interrupt signal may be transmitted to the processor. The processor may interrupt the current process based on the interrupt signal, and determine that the preset condition is satisfied. The processor may then perform the step of collecting the fingerprint parameter using the fingerprint recognition region.

In some embodiments, the physical button may be a power button, and when the user presses the power button, the terminal may start to perform fingerprint recognition to unlock the terminal, which simplifies operation steps and improves the user experience.

In some embodiments, the processor may include one or more CPUs (Central Processing Units).

In block 202, recognition is performed on the fingerprint parameter collected when the fingerprint parameter is collected successfully.

Procedures of the fingerprint parameter recognition may include procedures such as extracting detailed feature points in the fingerprint parameters. Then the terminal may store the fingerprint parameters and compare the fingerprint parameters with the parameters historically stored in the terminal. When the comparison is successful, the processor may unlock the terminal.

With the method provided by embodiments of the present disclosure, the fingerprint parameter collection may be performed by the fingerprint recognition region when the physical button is triggered, and the recognition may be performed on the fingerprint parameter collected when the fingerprint parameter is collected successfully. The aforementioned shortcomings associated with unlocking the terminal are solved, and the steps required to unlock the terminal are simplified.

In addition, embodiments of the present disclosure further provide another method for controlling a terminal, and the method may include the following steps.

In step one, fingerprint detection may be performed by the fingerprint recognition region at a first frequency.

The first frequency may be a lower frequency. That is, the fingerprint sensor may be configured to work in a low power mode. In this mode, the processor may merely determine whether a finger presses the fingerprint recognition region.

In step two, when the finger is detected by the fingerprint recognition region, the processor may perform fingerprint recognition at a second frequency. The second frequency may be greater than the first frequency.

The second frequency may be a work frequency at which the fingerprint recognition is normally performed in the fingerprint recognition region. In this manner, when the processor does not determine that the fingerprint recognition region is pressed by the finger, the fingerprint detection may be performed in the low power mode, i.e., to determine whether there is the finger pressing the fingerprint recognition region. When it is detected that there is the finger pressing the fingerprint recognition region, the fingerprint recognition may be performed at a normal work frequency, which may also achieve an effect of reducing the power consumption.

In step three, recognition may be performed on the fingerprint parameter collected when the fingerprint parameter is collected successfully.

Figure 13:
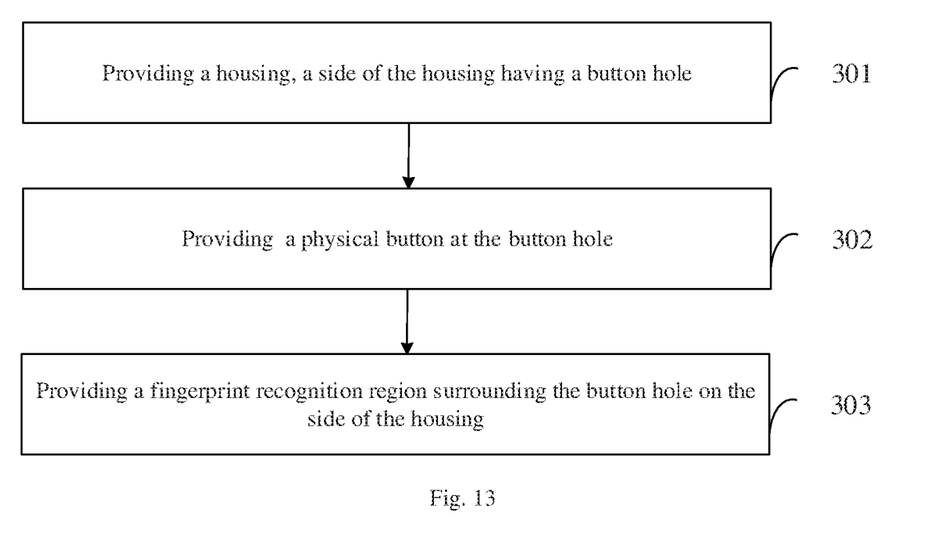
FIG. 13 is flow chart illustrating a method for manufacturing a terminal according to exemplary embodiments of the present disclosure.

FIG. 13 is flow chart illustrating a method for manufacturing a terminal provided by exemplary embodiments of the present disclosure. The method may be configured to manufacture the terminal provided by foregoing embodiments. The method may include the following blocks.

In block 301, a housing may be provided. A side of the housing may provide a button hole.

In block 302, a physical button may be provided at the button hole.

In block 303, a fingerprint recognition region surrounding the button hole may be provided on the side of the housing.

With the method for manufacturing the terminal provided by embodiments of the present disclosure, by combining the fingerprint recognition region with the region occupied by the physical button, the user may touch the fingerprint recognition region simultaneously when clicking the physical button. The aforementioned shortcomings associated with unlocking the terminal are solved, and the steps required to unlock the terminal are simplified.

Figure 14:
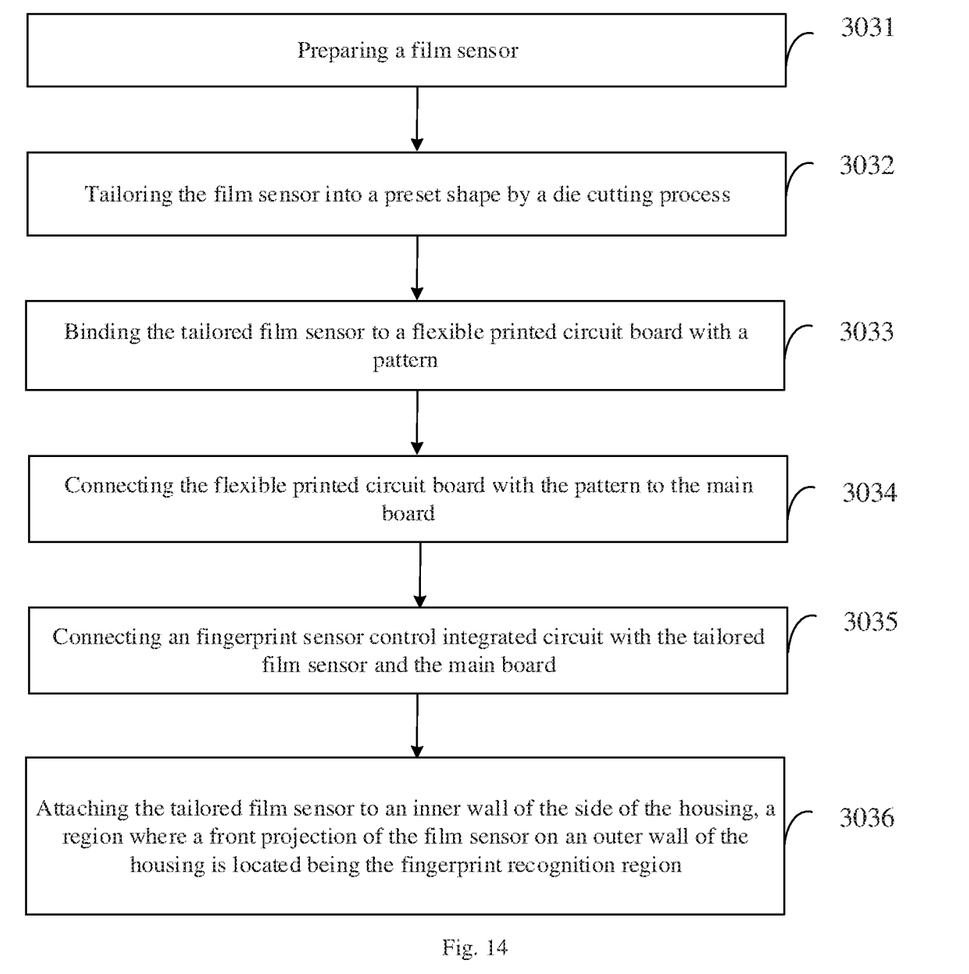
FIG. 14 is a flow chart of illustrating a method for providing a fingerprint recognition region illustrated in FIG. 13.

In some embodiments, as illustrated in FIG. 14, when the fingerprint sensor is a film sensor, the foregoing block 303 may include the following sub blocks.

In sub block 3031, a film sensor may be prepared.

In sub block 3032, the film sensor may be tailored into a preset shape by a die cutting process.

With respect to the preset shape, reference may be made to the fingerprint recognition region 32 in FIG. 3.

In sub block 3033, the tailored film sensor may be bound to a Flexible Printed Circuit Board (FPCB) with a pattern.

In some embodiments, the FPCB with the pattern may include an insulated substrate and a conductive layer, and there may be binder between the insulated substrate and the conductive layer. Bonding is a common wiring method used by those skilled in the art.

In sub block 3034, the FPCB with the pattern may be connected to the main board.

In some embodiments, the FPCB may be connected with the main board by a wire bonding process or ACF (Anisotropic Conductive Film).

In some embodiments, the connective position between the FPCB with the pattern and the main board may be protected by coating gel.

In sub block 3035, a fingerprint sensor control IC may be connected with the tailored film sensor and the main board.

In some embodiments, the fingerprint sensor control IC may be provided on the FPCB. The fingerprint sensor control IC may be connected with the tailored film sensor and the main board via a circuit on the FPCB. In some embodiments, the fingerprint sensor control IC may be directly provided on the main board (for example, the film sensor is provided on the FPCB or the main board by a Surface Mount Technology, or SMT), and the fingerprint sensor control IC may be connected with the tailored film sensor by the circuit on the FPCB.

In some embodiments, one or more inspection steps may be performed to determine whether the film sensor can work normally. If the film sensor can work normally, subsequent operations may be performed. If the film sensor cannot work normally, trouble diagnosis and troubleshooting may be performed.

In sub block 3036, the tailored film sensor maybe attached to an inner wall of a side of the housing. In some embodiments, a region where a front projection of the film sensor on an outer wall of the housing is located is considered/recognized as the fingerprint recognition region.

In some embodiments, sub block 3036 may include the followings process steps.

In a first step, an adhesive film may be tailored into the preset shape by a die cutting process, in which each of two sides of the adhesive film is provided with a protective film.

In a second step, the protective film on one side of the adhesive film may be removed, and the adhesive film may be attached to the tailored film sensor.

In a third step, the protective film on the other side of the adhesive film may be removed, and the adhesive film may be attached to the inner wall of the side of the housing.

In a fourth step, the adhesive film may be hardened by a hardening process.

The hardening process may include pressing and heating, etc. A confirmation step may be carried out to confirm whether the film sensor is firmly attached to the housing.

With the method for manufacturing the terminal provided by embodiments of the present disclosure, by combining the fingerprint recognition region with the region occupied by the physical button, the user may touch the fingerprint recognition region simultaneously when clicking the physical button. The aforementioned shortcomings associated with unlocking a terminal are solved, and the steps required to unlock the terminal are simplified.

Figure 15:
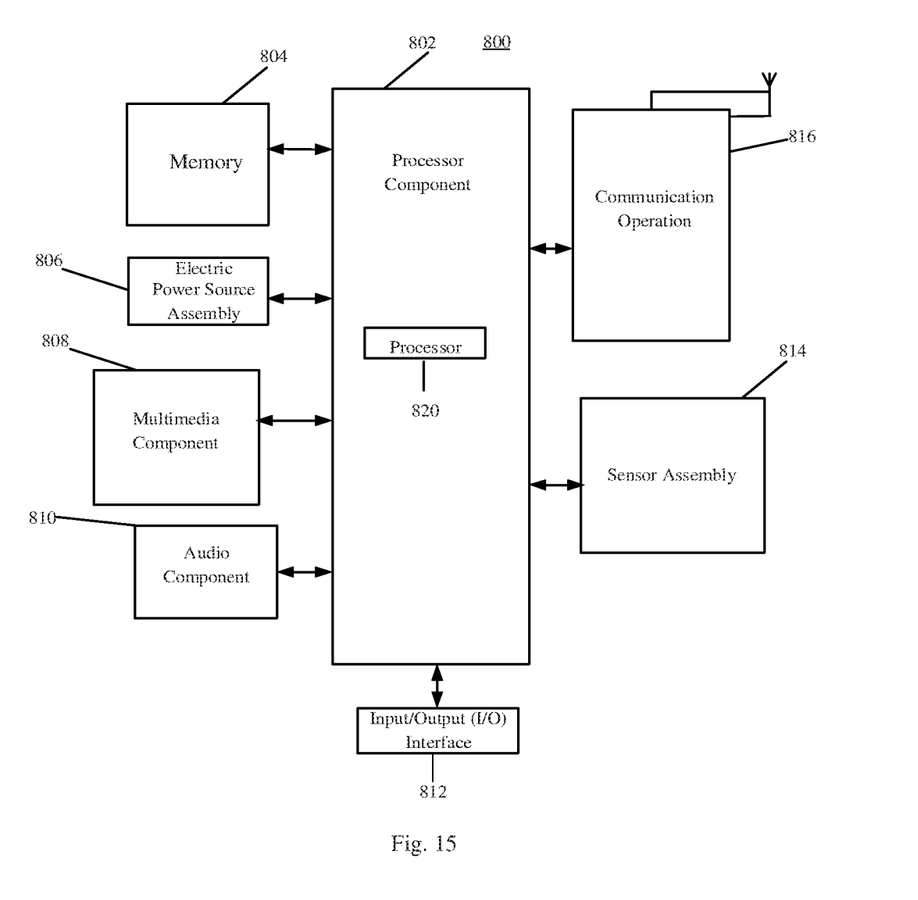
FIG. 15 is a schematic diagram illustrating a terminal according to exemplary embodiments of the present disclosure.

FIG. 15 is a block diagram illustrating a terminal 800 according to exemplary embodiments. For example, the terminal 800 may be a mobile phone, a computer, a digital broadcast terminal, an information transmitting and receiving device, a gaming console, a tablet device, a medical equipment, a fitness facility, a personal digital assistant or the like.

Referring to FIG. 15, the terminal 800 may include one or more components of: a processing component 802, a memory 804, a power component 806, a multimedia component 808, an audio component 810, an I/O (Input/Output) interface 812, a sensor component 814, and a communication component 816.

The processing component 802 may control the overall operation of the terminal 800, such as operations associated with display, telephone calls, data communications, camera operations, and recording operations. The processing component 802 may include one or more processors 820 to execute instructions and to complete all or part of the operations in the above described methods. In addition, the processing component 802 may include one or more modules which facilitate interaction between the processing component 802 and other components. For instance, the processing component 802 may include a multimedia module to facilitate interaction between the multimedia component 808 and the processing component 802.

The memory 804 may be configured to store various types of data to support operations at the terminal 800. Examples of such data include instructions for any applications or methods operated on the terminal 800, contact data, phonebook data, messages, pictures, videos, etc. The memory 804 may be implemented using any type of volatile or non-volatile storage devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 806 may provide power to various components of the terminal 800. The power component 806 may include a power management system, one or more power supplies, and other components related to generation, management, and distribution of power in the terminal 800.

The multimedia component 808 may include a screen that provides an output interface between the terminal 800 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a duration and a pressure associated with the touch or swipe action. In some embodiments, the multimedia component 808 includes a front camera and/or a rear camera. When the terminal 800 is in an operation mode such as a photographing mode or a video mode, the front camera and/or the rear camera may receive external multimedia data. Each of the front and rear cameras may be a fixed optical lens system or have a focus and optical zoom capability.

The audio component 810 may be configured to provide output and/or receive input audio signals. For example, the audio component 810 includes a microphone (MIC) configured to receive an external audio signal when the terminal 800 is in an operating mode, such as a call mode, a recording mode, and a speech recognition mode. The received audio signal may be stored in the memory 804 or transmitted via the communication component 816. In some embodiments, the audio component 810 may further include a speaker, which may be configured to provide output audio signals.

The I/O interface 812 may provide an interface between the processing component 802 and a peripheral interface module, such as a keyboard, a click wheel, a button and the like. The buttons may include, but are not limited to, a home button, a volume button, a starting button, and a locking button.

The sensor component 814 may include one or more sensors for providing status assessments of various aspects of the terminal 800. For example, the sensor component 814 may detect an open/closed state of the terminal 800, relative positioning of the components, such as the display and the keypad, of the terminal 800, a change in position of the terminal 800 or of a component of the terminal 800, presence or absence of user contact with that terminal 800, an orientation or an acceleration/deceleration of the terminal 800, or a change in temperature of the terminal 800. The sensor component 814 may include a proximity sensor configured to detect the presence of nearby objects without any physical contact. The sensor component 814 may also include a light sensor, such as a CMOS or CCD image sensor, for use in imaging applications. In some embodiments, the sensor component 814 may also include an accelerometer sensor, a gyroscope sensor, a magnetic sensor, a pressure sensor, or a temperature sensor.

The communication component 816 may be configured to facilitate wired or wireless communication between the terminal 800 and other devices. The terminal 800 can access a wireless network based on a communication standard, such as WiFi, 2G, or 3G, or a combination of them. In an exemplary embodiment, the communication component 816 may receive a broadcast signal or broadcast related information from an external broadcast management system via a broadcast channel In an exemplary embodiment, the communication component 816 may further include a near field communication (NFC) module to facilitate short-range communication. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the terminal 800 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the methods described above.

In some embodiments, there is also provided a non-transitory computer-readable storage medium, such as the memory 804, with instructions stored thereon. The instructions can be executed by the processor 820 of the terminal 800 to complete technical processing executed by the processor in the foregoing embodiments. For example, the non-transitory computer readable storage medium may be a read only memory (ROM), a random access memory (RAM), a compact disk—read only memory (CD-ROM), a magnetic tape, a floppy disk, an optical data storage device, and the like.

In some embodiments, a computer-readable storage medium is provided. The computer-readable storage medium may include a non-volatile computer-readable storage medium. The computer-readable storage medium may be stored with computer programs, which may be configured to be executed by a processor to realize a method for controlling a terminal provided by embodiments of the present disclosure. For example, the method may include: performing Fingerprint parameter collection by the fingerprint recognition region when a preset condition is satisfied; and performing recognition on the fingerprint parameter collected when the fingerprint parameter is collected successfully.

In the present disclosure, terms such as "first" and "second" are used herein for purposes of description and are not intended to indicate or imply relative importance or significance. The term "a plurality of" means two or more than two, unless specified otherwise.

Skilled in the art may understand that all or part of steps of the foregoing embodiments may be achieved in the form of hardware, or may be achieved by programs to instruct relative hardware. The programs may be stored in a computer readable storage medium. The above-mentioned storage medium may be a read only memory (ROM), a magnetic disk, a compact disk and the like.

The foregoing is merely illustrative of specific embodiments of the present disclosure and is not intended to limit the scope of the disclosure, and any modification, equivalent and improvement should be included within the scope of the present disclosure.

What is claimed is:

1. A terminal, comprising:
    a housing, a side of the housing having a button hole;
    a physical button provided at the button hole;
    a fingerprint recognition region provided on the side of the housing, the fingerprint recognition region surrounding the button hole;
    a fingerprint sensor provided in the housing, wherein a region where a front projection of the fingerprint sensor on an outer wall of the housing is located is the fingerprint recognition region, the fingerprint sensor is a film sensor attached to an inner wall of the housing, the inner wall of the housing is provided with a blind hole, and the film sensor is provided with a protuberance located in the blind hole; and
    a substrate configured to support a side of the film sensor facing away from the housing.

2. The terminal according to claim 1, wherein the side of the housing has a protruded curved surface.

3. The terminal according to claim 1, wherein the side of the housing is made of metal, plastic or glass.

4. The terminal according to claim 1, further comprising:
    a connected main board and a fingerprint sensor control integrated circuit,
    wherein the fingerprint sensor control integrated circuit is connected with the fingerprint sensor.

5. The terminal according to claim 1, wherein an area of the fingerprint recognition region is greater than an area of a region surrounded by the fingerprint recognition region.

6. The terminal according to claim 1, wherein the fingerprint sensor comprises a plurality of sub-sensors arranged in an array.

7. A method for controlling a terminal, applied to a terminal, wherein the terminal comprises a housing, a side of the housing having a button hole, a physical button being provided at the button hole, the side of the housing being further provided with a fingerprint recognition region surrounding the button hole, a fingerprint sensor being a film sensor attached to an inner wall of the housing, and a substrate configured to support a side of the film sensor facing away from the housing, wherein a region where a front projection of the fingerprint sensor on an outer wall of the housing is located is the fingerprint recognition region, and the inner wall of the housing is provided with a blind hole, and the film sensor is provided with a protuberance located in the blind hole, the method comprising:
    performing fingerprint parameter collection by the fingerprint recognition region when the physical button is triggered; and
    performing recognition on a fingerprint parameter collected when the fingerprint parameter is collected successfully.

8. A method for manufacturing a terminal, comprising:
    providing a housing, a side of the housing having a button hole;
    providing a physical button at the button hole;
    providing a fingerprint recognition region surrounding the button hole on the side of the housing; and
    providing a main board in the housing,
    wherein providing the fingerprint recognition region surrounding the button hole on the side face of the housing further comprises:
        preparing a film sensor;

tailoring the film sensor into a preset shape by a die cutting process;

binding the tailored film sensor to a flexible printed circuit board with a pattern;

connecting the flexible printed circuit board with the pattern to the main board:

connecting a fingerprint sensor control integrated circuit with the tailored film sensor and the main board; and attaching the tailored film sensor to an inner wall of the side of the housing so that a region where a front projection of the film sensor on an outer wall of the housing is located is the fingerprint recognition region.

9. The method according to claim 8, wherein attaching the tailored film sensor to the inner wall of the side of the housing comprises:

tailoring an adhesive film into the preset shape by the die cutting process, each of two sides of the adhesive film being provided with a protective film;

removing the protective film on one side of the adhesive film, and attaching the adhesive film to the tailored film sensor;

removing the protective film on the other side of the adhesive film, and attaching the adhesive film to the inner wall of the side of the housing; and hardening the adhesive film by a hardening process.

* * * * *